(12) United States Patent
Boecking

(10) Patent No.: US 6,930,435 B2
(45) Date of Patent: Aug. 16, 2005

(54) PIEZOELECTRIC ELEMENT

(75) Inventor: Friedrich Boecking, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 417 days.

(21) Appl. No.: 10/252,593

(22) Filed: Sep. 24, 2002

(65) Prior Publication Data

US 2003/0071328 A1 Apr. 17, 2003

(30) Foreign Application Priority Data

Sep. 27, 2001 (DE) .......................................... 101 47 666

(51) Int. Cl.$^7$ ............................................. H01L 41/08
(52) U.S. Cl. ........................ 310/317; 310/328; 310/366
(58) Field of Search ........................ 310/328, 363–366, 310/317, 319

(56) References Cited

U.S. PATENT DOCUMENTS

| | | | |
|---|---|---|---|
| 3,565,140 A | * | 2/1971 | Jacobsen ..................... 83/418 |
| 4,633,120 A | * | 12/1986 | Sato et al. ................... 310/328 |
| 5,165,809 A | * | 11/1992 | Takahashi et al. ..... 400/124.16 |
| 6,316,864 B1 | * | 11/2001 | Ormerod ..................... 310/328 |
| 6,707,231 B2 | * | 3/2004 | Pease et al. ................ 310/317 |

\* cited by examiner

*Primary Examiner*—Mark Budd
(74) *Attorney, Agent, or Firm*—Ronald E. Greigg

(57) ABSTRACT

A piezoelectric element for actuating a mechanical component, is proposed in which, with a multilayer structure of piezoelectric layers, the inner electrodes disposed between them can be subjected to an electrical voltage. Since the piezoelectric layers with the inner electrodes function like capacitors, a shunting resistor for a requisite electrical discharge is formed, preferably in the head or foot part, by forming resistor tracks out of a resistor layer.

12 Claims, 1 Drawing Sheet

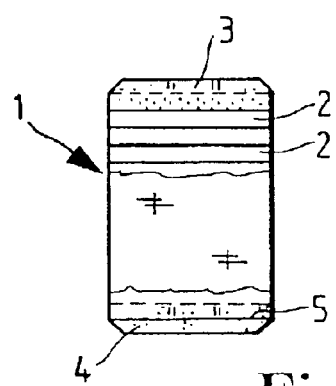
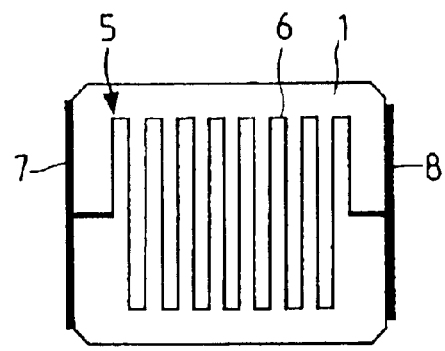
Fig.1　　　Fig.2
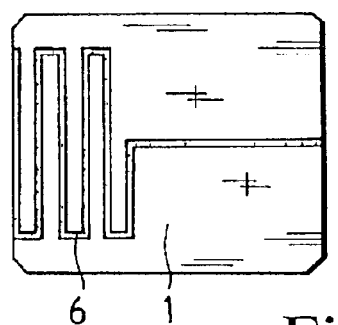
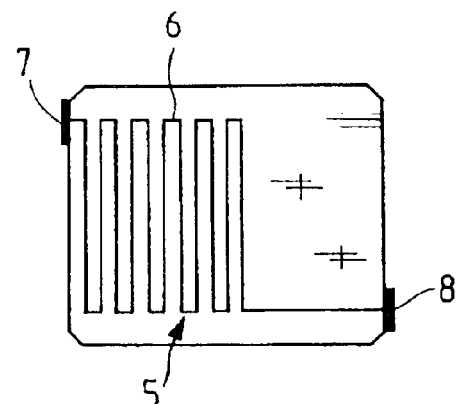
Fig.3　　　Fig.4
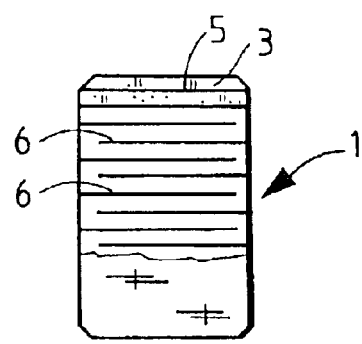
Fig.5

PIEZOELECTRIC ELEMENT

BACKGROUND OF THE INVENTION

1. Field of the Invention

The invention relates to an improved piezoelectric element, for example for a piezoelectric actuator for actuating a mechanical component, such as a valve or the like.

2. Description of the Prior Art

It is well known that by utilizing what is known as the piezoelectric effect, a piezoelectric element can be constructed from a material having a suitable crystalline structure. When an external electrical voltage is applied, a mechanical reaction of the piezoelectric element ensues, which as a function of the crystalline structure and of the regions where the electrical voltage is applied takes the form of compression or tension in a predeterminable direction. Because of this extremely fast and precisely regulatable effect, piezoelectric actuators of this kind can be provided for constructing final control elements, for instance for driving switching valves in fuel injection systems in motor vehicles. In that case, the voltage- or charge-controlled deflection of the piezoelectric actuator is utilized for positioning a control valve, which in turn regulates the stroke of a nozzle needle. A major advantage of piezoelectric actuators is the achievement of precise and very fast deflections with high forces.

Since the requisite electrical field intensities for actuating the piezoelectric actuator are in the range of several kV/mm, and as a rule moderate electrical voltages are desired for triggering purposes, the construction of this piezoelectric actuator can be done in multiple layers approximately 100 $\mu$m thick each (multilayer actuators). To that end, inner electrodes are present between the respective layers and are applied for instance by a printing process, and outer electrodes are present by way of which the electrical voltage is applied.

Because the ceramic layers here are connected electrically parallel, the requisite control voltage drops, compared to monolithic piezoelectric actuators of the same length and with the same number of layers. A typical method for producing such layers is sheet casting, in which the individual layers are metallized and stacked one above the other.

From European Patent Disclosure EP 0 844 678 A1, one such piezoelectric actuator is known in which two outer electrodes of different polarity are present, applied to respective opposed sides of the piezoelectric actuator block. Upon contacting of the inner electrodes with the lateral outer electrodes, the contacting changing from one layer to the next, the respective contacting takes place in the region where in the respective adjacent layer, no inner electrode is extended to the outside.

The layers having the inner electrodes function among one another as capacitors, so that to assure the electrical discharge of the total capacitance, a shunting resistor is as a rule connected parallel. For instance, this can be done with a wire resistor in the region of a plug of a connecting device. However, in that case the production process is relatively complicated, since the resistor must additionally be soldered and also requires additional space. Moreover, care must be taken to assure that this arrangement also withstand jarring stresses, which makes the construction more difficult.

At the head and foot part of these known piezoelectric actuators, the inner electrodes are as a rule absent, since on the one hand a certain insulation distance from the end faces is necessary to prevent short circuits to the outside, and on the other, passive zones are utilized for electrically connecting the outer electrodes.

OBJECT AND SUMMARY OF THE INVENTION

The piezoelectric element of the invention is, as mentioned, constructed with a multilayer structure of piezoelectric layers and inner electrodes disposed between them, and with a bonding or contacting of the inner electrodes that changes from one layer to the next, for subjection to an electrical voltage. In a first embodiment of the invention, in a structure with a passive head and foot part, a resistor layer is advantageously disposed in the head and/or foot part, and the terminals of the shunting resistor thus formed are contacted with or bonded to the outer electrodes.

This resistor layer can advantageously be applied to the head and/or foot part in a printing process and is subsequently calibratable; the resistor layer can either be oriented on the inside toward the active inner electrodes or be applied on the outside on the cover layer. For instance, the tracks of the resistor can be shifted into a side region such that an arrangement of the tracks at a predetermined spacing from one side of the outer electrode is obtained. Preferably, the resistor is formed by meandering tracks, which are produced by being cut free from the resistor layer. The tracks of the resistor are formed of Cu, AgPd, or AgPt, for instance, and the cutting free is preferably done by laser machining.

With the arrangement according to the invention, it can be attained in a simple way that an electrical discharge of the inner electrode layer, acting as capacitors, is assured via a shunting resistor connected to the outer electrodes. By the integration, according to the invention, of this resistor with the piezoelectric element, the effort and cost of production are shifted to the piezoelectric element, or the piezoelectric actuator. Because a separate external contacting is eliminated, economies of cost can be achieved.

In a second embodiment, in a sunken arrangement of the inner electrodes, a resistor layer is disposed on the outside of the piezoelectric element. The tracks of the resistor are shifted into the regions of the outside that are not in contact with inner electrodes, and here as well, the terminals of the shunting resistor thus formed are contacted with the outer electrodes.

BRIEF DESCRIPTION OF THE DRAWINGS

The invention will be better understood and further objects and advantages thereof will become more apparent from the detailed description contained herein below, taken in conjunction with the drawings, in which:

FIG. 1 shows a schematic view of a piezoelectric element with the piezoelectric layers and with a passive head and foot part;

FIG. 2 shows a first embodiment of resistor tracks of a shunting resistor;

FIG. 3 shows a second embodiment of resistor tracks of a shunting resistor, with regions cut free by a laser;

FIG. 4 shows a different view of the exemplary embodiment of FIG. 3; and

FIG. 5 shows a schematic view of a piezoelectric element with the piezoelectric layers and a passive head and foot part and with a resistor in a cover layer.

DESCRIPTION OF THE PREFERRED EMBODIMENTS

In FIG. 1, as the piezoelectric element, a piezoelectric actuator 1 is shown, which is constructed in a manner known per se of layers 2 of piezoelectric sheets of a quartz material of a suitable crystalline structure, so that by utilizing the so-called piezoelectric effect, when an external electrical voltage is applied via outer electrodes, not shown here, to inner electrodes applied to the ceramic layer, a mechanical reaction of the piezoelectric actuator 1 in its longitudinal axis ensues.

The outer electrodes are each bonded to the inner electrodes that have the same polarity. Every second one of the inner electrodes of the same polarity is extended through to one side of the piezoelectric actuator 1, where it is contacted, and on the respectively other side, it is insulated from the outer electrode there of the respective other polarity by a spacing. Onto the longitudinally outer piezoelectric layers 2, an electrically insulating head part 3 and foot part 4 are also applied, which each represent a mechanically passive region and by which the entire piezoelectric actuator 1 can be insulated from the outside.

A resistor layer 5 is indicated on the foot part 4 in FIG. 1 and is shown in further detail in FIG. 2. It can be seen from the latter that out of the resistor layer 5, a meandering resistor track 6 is formed, which is connected by its ends to outer electrodes 7 and 8 and therefore forms the shunting resistor described in the introduction to the present specification.

It can be seen from FIG. 3 how the resistor tracks 6 are cut free from the resistor layer 5 with a laser, and from FIG. 4, the connection to the outer electrodes 7 and 8 can also be seen. The resistor tracks of FIGS. 3 and 4 are located here in only one region of the surface area of the piezoelectric layers 2, but any geometrical arrangements, if they meet the resistance values, are possible.

The alternative arrangement of FIG. 5 shows a piezoelectric element 1 in which the resistor layer 5 is applied to the cover layer of the head part 3; the embodiment and connection of the resistor track 6 is done as described above.

The foregoing relates to preferred exemplary embodiments of the invention, it being understood that other variants and embodiments thereof are possible within the spirit and scope of the invention, the latter being defined by the appended claims.

I claim:

1. A piezoelectric element, comprising
   a multilayer structure of piezoelectric layers (2), between a passive head and foot part (3, 4) and with inner electrodes disposed between them that can be acted upon by an electrical voltage,
   a bonding, changing from one layer to the next, of the inner electrodes with at least one outer electrode (7, 8) for each polarity, the bonding being effected in each case in the region where no inner electrode is extended to the outside in the respective adjacent layer, and
   a resistor layer (5) disposed in the passive head and/or foot part (3, 4), the terminals of the resistor layer thus formed being contacted with the outer electrodes (7, 8).

2. The piezoelectric element of claim 1, wherein
   the resistor layer (5) comprises a layer applied to the head and/or foot part (3, 4) in a printing process and subsequently calibrated.

3. The piezoelectric element of claim 1, wherein
   the resistor layer (5) is in the form of tracks (6), and
   the tracks (6) of the resistor layer are shifted into a side region such that an arrangement of the tracks (6) at a predetermined spacing from one side of the outer electrode (8) is obtained.

4. The piezoelectric element of claim 2, wherein
   the resistor layer (5) is in the form of tracks (6), and
   the tracks (6) of the resistor layer are shifted into a side region such that an arrangement of the tracks (6) at a predetermined spacing from one side of the outer electrode (8) is obtained.

5. A piezoelectric element, comprising
   a multilayer structure of piezoelectric layers (2), between a passive head and foot part (3, 4) and with inner electrodes disposed between them that can be acted upon by an electrical voltage,
   a bonding, changing from one layer to the next, of the inner electrodes with at least one outer electrode (7, 8) for each polarity, the bonding being effected in each case in the region where no inner electrode is extended to the outside in the respective adjacent layer,
   a resistor layer disposed on the outside of the piezoelectric element in a sunken arrangement of the inner electrodes, the tracks of the resistor being shifted into the regions of the outside that are not in touch contact with inner electrodes, and
   the terminals of the resistor layer thus formed being contacted with the outer electrodes.

6. The piezoelectric element of claim 5, wherein
   the resistor layer (5) comprises a layer applied to the outside of the piezoelectric element (1) in a printing process and subsequently calibratable.

7. The piezoelectric element of claim 1, wherein
   the resistor layer (5) is in the form of meandering tracks (6) which are produced by being cut free from the resistor layer (5).

8. The piezoelectric element of claim 2, wherein
   the resistor layer (5) is in the form of meandering tracks (6) which are produced by being cut free from the resistor layer (5).

9. The piezoelectric element of claim 3, wherein
   the resistor layer (5) is in the form of meandering tracks (6) which are produced by being cut free from the resistor layer (5).

10. The piezoelectric element of claim 5, wherein
    the resistor layer (5) is in the form of meandering tracks (6) which are produced by being cut free from the resistor layer (5).

11. The piezoelectric element of claim 6, wherein
    the resistor layer (5) is in the form of meandering tracks (6) which are produced by being cut free from the resistor layer (5).

12. The piezoelectric element of claim 7, wherein
    the tracks (6) of the resistor are formed of Cu, AgPd, or AgPt, and the cutting free is done by laser machining.

* * * * *